United States Patent [19]

Pennebaker

[11] Patent Number: 5,414,423
[45] Date of Patent: May 9, 1995

[54] STABILIZATION OF PROBABILITY ESTIMATES BY CONDITIONING ON PRIOR DECISIONS OF A GIVEN CONTEXT

[75] Inventor: William B. Pennebaker, Carmel, N.Y.

[73] Assignee: International Business Machines Corporation, Armonk, N.Y.

[21] Appl. No.: 54,989

[22] Filed: Apr. 29, 1993

[51] Int. Cl.$^6$ .............................................. H03M 7/00
[52] U.S. Cl. ...................................... 341/107; 341/51
[58] Field of Search .................. 341/51, 107, 106, 109, 341/95, 67, 65

[56] References Cited

U.S. PATENT DOCUMENTS

| | | | |
|---|---|---|---|
| 4,749,983 | 6/1988 | Langdon | 341/107 |
| 4,905,297 | 2/1990 | Langdon et al. | 382/56 |
| 4,935,882 | 6/1990 | Pennebaker et al. | 364/554 |
| 5,023,611 | 6/1991 | Chamzas et al. | 341/51 |
| 5,025,258 | 6/1991 | Duttweiler | 341/107 |
| 5,043,852 | 9/1991 | Mitchell et al. | 341/51 |
| 5,142,283 | 8/1992 | Chevion et al. | 341/107 |

*Primary Examiner*—Brian K. Young
*Attorney, Agent, or Firm*—Thomas P. Dowd; Richard M. Ludwin

[57] ABSTRACT

A system and method involving a statistical conditioning technique that improves the coding efficiency in compression systems which have unstable statistical properties by conditioning the probability estimate for a given model context on prior decisions for that context thus enlarging the conditioning decision set. Instead of extending the model context by increasing the range of prior decisions in the pixel neighborhood, each model context is expanded into a set of two contexts which are the actual coding contexts. For a given probability estimation model context, the selection of a coding context index is done on the basis of the previous coding decision (1 or 0) for that model context. Thus, if a model context is assigned an index A, the coding context would be assigned an index $2*A + D(A)'$, where $D(A)'$ is the previous (immediately preceding) binary decision for model context A; the decision of which coding context to use turns on whether the model context was used most recently for coding a 1 or a 0. More generally, each model context index A is expanded into a set of $2N$ coding context indices, where N is the number of previous decisions for model context index A used in the conditioning of, for example, an arithmetic coding decision. The addressing of the context expansion can be done in any way which expands the total number of contexts by a factor of $2N$. The index for a case where the expansion is by one decision bit may be $2*A + D(A)'$, whereas in the case where the expansion is by two decision bits the index may be $4*A + 2*D(A)' + D(A)''$.

16 Claims, 1 Drawing Sheet

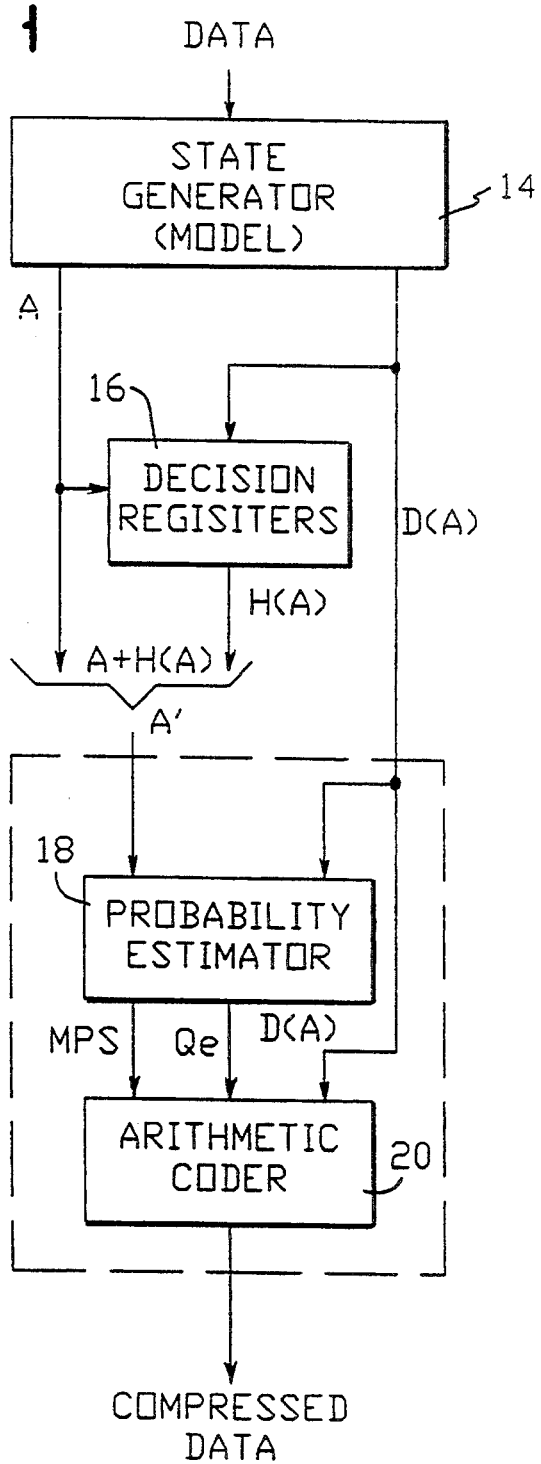

STABILIZATION OF PROBABILITY ESTIMATES BY CONDITIONING ON PRIOR DECISIONS OF A GIVEN CONTEXT

FIELD OF THE INVENTION

The present invention relates to data compression and more particularly to a system and method for the conditioning of a probability estimate for a given model context on prior decision for that context when dealing with unstable model statistics.

PROBLEM TO BE SOLVED

Coding systems with simple statistical models sometimes have problems with unstable statistical estimates. For example, the well-known ABIC 7-pel template model (see the November, 1988 issue of the IBM JOURNAL OF RESEARCH AND DEVELOPMENT) exhibits this kind of behavior. It is very effective for compression of both text documents and binary halftone images. However, experiments with the Q-Coder probability estimation scheme (again see IBM JRD November, 1988) have shown that for the ABIC model the probability estimates are not always stable, but that significant compression improvements can be obtained by using a more complex multi-rate adaptation scheme (see U.S. Pat. No. 4,935,882, to PENNEBAKER AND MITCHELL). Still, the estimation state machine of this multi-rate scheme is quite complex. Hence, a simpler technique would be desirable to achieve efficient coding when unstable statistical estimates are encountered by various models for compression.

Adaptive binary arithmetic coders such as the Q-Coder (see U.S. Pat. No. 4,905,297, to LANGDON, MITCHELL, PENNEBAKER AND RISSANEN), or the lineal descendent of the Q-Coder used in the emerging ISO JPEG/JBIG image compression standards (e.g., ISO DIS 10918-1, CCITT Recommendation T.81 —see "JPEG Still Image Data Compression Standard" by William B. Pennebaker and Joan L. Mitchell, Van Nostrand Reinhold, 1993 ISBN 0-442-01272-1), imbed a dynamic probability estimation process into the coding procedures. Each coding system incorporates a statistical model which describes how each coding decision is "conditioned" on prior coding decisions. The statistical models used with the coders work best when the probability estimates are slowly varying or stable. Then, once the learning stage is complete, the estimates are quite accurate, and coding efficiencies are nearly optimum. However, if the probabilities are sufficiently unstable so that the coder cannot maintain an accurate probability estimate, the coding efficiency suffers.

One approach to achieving at least a partial solution to this problem is to try by some means to detect that the estimate is poor, and when this is detected, adapt to new estimates more quickly. For example, unstable probability estimates are detected in the above-mentioned multi-rate version of the estimation process used in the Q-Coder by looking at the correlation between renormalizations on MPS (more probable symbol) and LPS (less probable symbol) paths. While varying the adaptations rate can improve coding efficiencies significantly, there is still a basic tradeoff between coding efficiency for statistically stable data and rapid adaptations. In general, for a given estimation system the more rapid the adaptation rate, the more variation there will be in the estimates of a stable probability. As the estimate variation increase, the average coding efficiency decreases.

Consequently, in reconciling the conflicting goals of fast adaptation and good steady state performance in arithmetic coding probability estimators, the best solution to the problem would seem to be to devise statistical models, i.e., probability estimation model contexts, which produce state estimates. A common way to achieve this is to enlarge the conditioning to include more and more decisions from the coding of neighboring pixels. But, each binary decision added to the sequence doubles the number of conditioning states. Accordingly, this can quickly lead to very large arrays of probability estimates and can introduce so much overhead for initial learning that the coding efficiency drops. In general, as the number of contexts grows, the ability of the coder to initially learn and then adapt to changing probabilities is adversely affected. When the number of contexts becomes very large this condition is sometimes known as "context dilution". Even with the very effective rapid initial learning in the JPEG/JBIG coder, context dilution effectively limits what can be done by this approach. It will therefore be seen that a problem is posed in data processing when coding with various models for compression, if unstable statistical estimates are encountered, and the present invention is directed to overcoming this problem.

PRIOR ART

Various solutions have been offered to overcome the problem of unstable model statistics. For example, in U.S. Pat. No. 5,023,611, to CHAMZAS AND DUTTWEILLER, the approach deals with an "adaptive context", in which a single sample of the neighborhood is allowed to lag behind the rest of the neighborhood template, in order to pick up the digital halftone repeat pattern. This is related to earlier work on line reformatting and one-line contexts which bridge the halftone repeat patterns. It is one method for getting stable probability estimates, but is operable only for the particular neighborhood template models used in binary image coding. Also, unlike the present invention, if cannot be used with any model.

The above-noted U.S. Pat. No. 4,935,882, to PENNEBAKER AND MITCHELL, involves renormalization-driven probability estimation as used in the Q-coder. The present invention complements this estimation technique, i.e., for the same context storage requirement the invention offers a more effective alternative to the multi-rate estimation technique that is taught by this patent.

U.S. Pat. No. 5,045,852, to MITCHELL, PENNEBAKER, AND RISSANEN, teaches a way of dynamically switching between a set of different models for compression, based on criteria which select the model which gibes the maximum coding efficiency. The present invention describes a single model, although it could be applied to a switched model system such as this one. Dynamic model switching is another way to try to get more stable statistics; for a given set of data, models with unstable statistics generally do not perform as well as those with stable statistics (assuming a similar level of model complexity).

The three preceding prior approaches offer alternative solutions to the problem of unstable model statistics, which, when applied to statistics that are unstable, can be considered to be complementary to the technique embodied in the present invention.

The above-noted U.S. Pat. No. 4,905,297, to LANGDON, MITCHELL, PENNEBAKER AND RISSANEN, teaches the Q-code system and discloses the specific table used in the Q-coder, as well as a number of other aspects. This represents one possible form of arithmetic coding that can be used with the present invention.

U.S. Pat. No. 5,025,258, to D. L. DUTTWEILER, discloses a probability estimation technique based on two thresholds. The first threshold represents a minimum count which must be exceeded before a new estimate is used; the second represents a maximum threshold which presents overflow in the event that one symbol is much less probable than the other. This represents another of the many variations on the estimation of probabilities.

OBJECTS

It is accordingly an object of the present invention to provide an alternate and more effective way of improving the coding performance of statistically unstable systems.

It is another object of the present invention to provide a system and technique that reconcile the conflicting goals of fast adaptation and good steady state performance in arithmetic coding probability estimators.

It is a further object of the present invention to provide a system and technique that significantly improve fast adaptation without adversely effecting the steady state performance obtained with state of the art arithmetic coders.

SUMMARY OF THE INVENTION

The present invention provides a system and method involving a statistical conditioning technique that has the same properties as very rapid dynamic adaptation of probability estimates and thus improves the coding efficiency in compression systems which have unstable stable statistical properties. It embodies the conditioning of a probability estimate for a given model context on prior decisions for that context and constitutes an effective way of enlarging the conditioning decision set. Instead of extending the model context by increasing the range of prior decisions in the pixel neighborhood, each model context is expanded into a set of two or more contexts which are the actual coding contexts. Consequently, in accordance with the invention are a set of contexts generated by the model, and a larger set of contexts, derived from the model contexts, used by a compression coder such as an entropy coder, e.g., an arithmetic coder, and even a non-adaptive coder, to select the coding decision probability. Herein the term "model context" will be used for a context generated by the model, and "coding context" will be used for a context used in the arithmetic coding decision. Each model context and coding context is identified by a unique index.

For a given probability estimation model context, the selection of a coding context is done on the basis of the previous coding decision (1 or 2) for that model context. Thus, if a model context has an index A, the coding context selected would have an index $2*A + D(A)'$, where $D(A)'$ is the previous (immediately preceding) binary decision for model context A. Accordingly, the decision of which coding context to use turns on whether the model context was used most recently for coding a 1 or a 0.

More generally, model context index A is expanded into a set of $2N$ coding context indices, where N is the number of previous decisions for model context index A used in the conditioning of the arithmetic coding decision. The addressing of the context expansion can be done in any way which expands the total number of contexts by a factor of $2N$. Thus, the coding context index for a case where the expansion is by one decision bit may be $2*A + D(A)'$, whereas in the case where the expansion is by two decision bits the index may be $4*A + 2*D(A)' + D(A)''$.

A block diagram of the system for a coding model with M bits of coding for a model context with index A, and N bits of history decision with value H(A), may be as shown in FIG. 1. The coding context index value would then be $(2**N)A + H(A)$, if the N bits were the low order bits of the coding context index.

This form of expanded conditioning effectively allows very rapid adaptation. For example, consider a given coding context and decision D(t) at time t, and the immediately prior decision for the same context, D(t-1). If very rapid adaptation is needed, then the probability, $P(D(t)|D(t-1)=1)$, is likely to be quite different from $P(D(t)|D(t-1)=0)$. The form of expanded context conditioning herein described automatically accounts for that situation, i.e., by providing an ability to switch to a completely different estimate as a function of the immediate history of prior decision bits, effectively provides for very rapid adaptation.

BRIEF DESCRIPTION OF THE DRAWINGS

FIG. 1 is a block diagram illustrating a system an encoder with a coding model, with M bits of coding model context with value A, and N bits of history decision with value H(A), in accordance with the present invention.

DETAILED DESCRIPTION OF THE PREFERRED EMBODIMENT

The present invention is directed to adaptive coding systems for data compression using probability estimation and embodies a system and method which condition a probability estimate for a given model context on prior decisions for that context. It enlarges the conditioning decision set, not through extending the contact by increasing the range of prior decisions in the pixel neighborhood as in the prior art, but rather by expanding each model context into a set of at least two contexts actually used for coding, i.e., "coding contexts". The selection between the two coding contexts for a given probability estimation model context is done on the basis of the previous coding decision (1 or 0) for that model context. By way of example, a model context may be assigned an index A, and the coding context assigned an index $2*A + D(A)'$, where $D(A)'$ is the previous binary decision for the model context, i.e., 1 or 0. The decision of which coding context to use turns on whether the model context was used most recently for coding a 1 or a 0, and the corresponding binary decision is selected for the coding context to be used.

More generally, each model context has an index, A, which is expanded into a set of $2**N$ coding context indices, where N is the number of previous decisions for model context index A used in the conditioning of the arithmetic coding decision.

Accordingly, given a model which produces a model context index A, the context array expansion is as follows:

If one previous decision, D(A)', is used, then for each value of A:

```
       D(A)'
    A  — 1 —

— |

--- 0 ---
``` a) Expansion by one decision bit.

It two previous decision bits, D(A)' and D(A)", are used, then for each value of A:

```
        D(A)'   (D(A)"

--- 1 -- |

A  |   --- 0 ---

-- |

|   --- 1 ---

--- 0 -- |

--- 0 ---
``` b) Expansion by two decision bits.

The addressing of the context expansion can be done in any way which expands the total number of coding contexts by a factor of 2**N. Thus, the index of case a) above may be 2*A+D(A)', whereas for case b), it may be 4*A+2*D(A)'+D(A)".

A block diagram of the system for a coding model with M bits of coding for a model context with index A, and N bits of history decision with value H(A), may be as shown in FIG. 1. The coding context index value would then be (2**N)A+H(A), if the N bits were the low order bits of the coding context index. Digital data is used in state generator 14 to generate an M bit context A and the binary decision D(A). The context A is used to interrogate decision registers 16 where the last N previous decisions D(A) associated with each context are stored. N is a figure selected to provide an advantageous compression result. Three previous decisions may be an appropriate figure for N in the case of half tone images since as shown in Table 1 it results in significant improvement in compression. However, for the table it appears that N equal to one decision would be appropriate for black and white textural images since it appears that "context dilution" sets in with two previous decisions of the same M-bit pattern.

The decision bit pattern H(A) from the previous N decisions is read out of the register and concatenated onto the original context A to form a new context A' where A'=A, H(A). Context A' is fed into the probability estimator 18 to generate the most probable symbol MPS and the least probable symbol LPS or Qe. MPS and Qe are then used by the arithmetic coder along with the decision D(A) to generate the compressed data. The decision D(A) is also used by the decision registers 16 to update the N previous decision bits associated with the particular string of M context bits for context A.

This form of expanded conditioning effectively allows very rapid adaptation. For example, consider a given model context and decision D(t) at time t, and the immediately prior decision for the same model context, D(t-1). If very rapid adaptation is needed, then the probability, P(d(t)|D(t-1)=1), is likely to be quite different from P(D(t)|D(t-1)=0). The form of expanded context conditioning of the invention automatically accounts for that situation, effectively allowing very rapid adaptation. More particularly, if N is very large, enough bits are included in the coding context that symbols can be counted and a direct and fairly accurate estimate made of the decision probability for the model context. The adaptive arithmetic coder also keeps estimates of the decision probabilities, and if the probabilities are stable, the two estimates should be consistent. If the probabilities are unstable, however, the prior decision values will not have a random distribution in the coding context, and the internal estimator in the arithmetic coder will project, based on past experience with the particular sequence of prior decisions, the appropriate probability estimate to use in coding that model context with that sequence. The present invention, by providing an ability to switch to a completely different estimate as a function of the immediate history of prior decision bits, thus effectively provides for very rapid adaptation. The effectiveness of the present invention is not limited to large N, however. Typically, most of the benefit is derived from conditioning on the first one or two prior decisions.

This technique can be used with an arbitrary number of prior coding decisions for each model context. However, just as in other schemes for extending or expanding the conditioning, each bit added to the context address doubles the number of probability estimates required. Therefore, practical considerations will limit the degree to which this might be desirable. In addition, most of the gain in compression comes from the very first expansion.

It is possible to apply this method selectively, only expanding a model context when the statistical model shows signs of instability for that context. This expanded context concept can be overlaid onto any conditioning scheme, independent of the rest of statistical model. Statistical instability can be estimated from renormalization correlation, as disclosed in above-noted U.S. Pat. No. 4,935,882, to PENNEBAKER AND MITCHELL. Typically, the statistical instability of a given model context is detected when the probability of renormalization of a given type (MPS or LPS) following renormalization of the same type exceeds approximately 0.5.

The invention has been implemented in software and successfully tested using the above-cited well-known ABIC model with a standard Q-Coder. Some experimental results are listed in Table 1 for the standard CCITT text images and in Table 2 for some binary halftone images. For reference purposes, data for the multi-rate Q-coder are also shown.

TABLE 1

| image | Text Images (Standard CCITT test set) | | | Multi-rate Q-coder |
|---|---|---|---|---|
| | coding context bits | | | |
| | 0 | 1 | 2 | |
| ptt1 | 119752 | 119232 | 119216 | 119000 |

TABLE 1-continued

| | Text Images (Standard CCITT test set) | | | |
|---|---|---|---|---|
| | coding context bits | | | Multi-rate |
| image | 0 | 1 | 2 | Q-coder |
| ptt2 | 71568 | 71544 | 71760 | 70696 |
| ptt3 | 187728 | 185240 | 184784 | 185952 |
| ptt4 | 446816 | 446632 | 447704 | 444184 |
| ptt5 | 215888 | 214232 | 214016 | 214120 |
| ptt6 | 112256 | 111464 | 111000 | 110544 |
| ptt7 | 468232 | 468496 | 468920 | 462840 |
| ptt8 | 124768 | 124016 | 124624 | 123056 |
| total | 1747008 | 1740856 | 1742024 | 1730392 |
| % gain | — | 0.4 | 0.3 | 1.0 |

TABLE 2

| | Binary Halftones | | | | |
|---|---|---|---|---|---|
| | coding context bits | | | | Multi-rate |
| image | 0 | 1 | 2 | 3 | Q-coder |
| budking | 966480 | 810072 | 763768 | 705528 | 879176 |
| boat2 | 154744 | 141200 | 138496 | 138216 | 147680 |
| jphmesh | 184016 | 132864 | 105752 | 105552 | 144192 |
| Total | 1305240 | 1084136 | 1008016 | 949296 | 1171048 |
| % gain | — | 16.9 | 22.8 | 27.3 | 10.3 |

The trends are quite clear from this data. There is a slight improvement for text images, as would be expanded if the statistical behavior is stable; and, the improvement for binary halftones is much larger, as would be expected if the statistical behavior is unstable.

Comparisons with the above-mentioned multi-rate estimation version of the Q-coder are also indicative. While the multi-rate system gives slightly better performance on text images than the expanded context system of the invention, the expanded context scheme performs significantly better on halftones. It should be noted, however, that models tuned explicitly to the repeat pattern in the halftone image will do still better.

Most of the better performance of the multi-rate coder on text images comes from the better coding efficiency on stable statistics for the multi-rate version. In addition, the multi-rate system has a more rapid initial learning stage. The latest JPEG/JBIG arithmetic coder estimation scheme (i.e., ISO DIS 10918-1, CCITT Recommendation T.81-cited above) incorporates a still more effective initial learning stage and also provides better coding efficiency for stable statistics. This latter property comes from the more fine-grained state machine in this JPEG/JBIG coder; it, therefore, is not as robust as the Q-coder in unstable systems.

Many coding systems will use the arithmetic coder being incorporated into the JPEG/JBIG standards, and for this coder the advantage in using the expanded context scheme herein described should be even larger. The context dilution problems during initial learning will be smaller, and the improvement in coding efficiency for stable estimates should be larger.

While the current ISO JBIG committee for binary image compression has chosen to use relatively large contexts and something known as an "adaptive template" to stabilize the probability estimates, the present invention provides a different approach which has a potential for simpler and more robust models. It offers an alternative method for enlarging context arrays which could have significant impact on any coding system which uses dynamic probability estimation, and which might under some conditions be statistically unstable. Further, the approach of the system and method of the present invention offers versatility in that it can be used with any model.

It is also contemplated that the invention may be used with dynamic model switching, in that conditioning on prior decisions can be incorporated into one of the models, i.e., if at least one of the model contexts has a coding context that contains at least one previous binary coding decision for the respective model context. Further, a coding system in accordance with the invention may contain means for expanding the model context whenever unstable probability estimates are encountered during coding; and in the case where the system involves an arithmetic coder, the model context may be expanded whenever excess correlation between renormalizations of the arithmetic coder occurs during coding. The invention may also be extended to apply to the general case of an N-ary (as compared to binary) arithmetic coder, and to other forms of entropy coding.

What is claimed is:

1. A method for improving the coding performance of adaptive data compression systems having unstable statistical properties in their probability estimation model contexts, comprising the steps of:
    expanding each probability estimation model context of M binary bits into a larger coding context with at least one additional bit concatenated onto the original M bits of the particular probability estimation model context where the concatenated bit is one of two possible binary bits (1 and 0) resulting from a binary coding decision D(A) associated with a previous probability estimation model context made up of the identical M bits; and
    applying the larger coding context in compressing data.

2. A method as in claim 1 wherein the compressing of data includes an arithmetic coding decision using a given model context assigned an index A which is expanded into a context A, N, where N is the number of previous decisions for said given model context used in the conditioning of the arithmetic coding decision.

3. A method as in claim 2 wherein the coding context is assigned an index 2*A+D(A), where D(A) is the previous binary coding decision for the respective model context.

4. A method as in claim 2 wherein the coding context is assigned an index 4*A+2*D(A)'+D(A)", where D(A)' and D(A)" are the previous binary coding decisions for the respective model context.

5. A method as in claim 2 wherein said model context has M bits of coding and N bits of history decision with value H(A), and the coding context is assigned an index (2**N)A+H(A), if the N bits were the low order bits of the coding context index.

6. A method as in claim 1 wherein at least one of the model contexts is expanded to a coding context that contains at least one previous binary coding decision for the respective model context for use in dynamic model switching during coding.

7. A method as in claim 1 wherein said model contexts are expanded set of at least two coding contexts whenever unstable probability estimates are encountered during coding.

8. A system for improving the coding performance of adaptive data compression systems having unstable statistical properties in their probability estimation model contexts, comprising:
    means for expanding each probability estimation model context of M binary bits into a larger coding context with at least one additional bit concatenated onto the original M bits of the particular probability estimation model context where the concatenated bit is the one of two possible binary bits (1 and 0) resulting from the decision D(A) associated with a previous probability estimation model context made up of the identical M bits; and means for applying the selected coding context in compressing data.

9. A system as in claim 10 wherein the compression of data involves an arithmetic coding decision and further comprising means for assigning a given model context an index A; and means for expanding said given model context into a larger coding context where N is the number of previous decisions for said given model context used in the conditioning of the arithmetic coding decision.

10. A system as in claim 9 further comprising means for assigning the coding context an index $2*A+D(A)$, where D(A) is the previous binary coding decision for said given model context.

11. A system as in claim 9 further comprising means for assigning the coding context an index $4*A+2(D(A)'+D(A)''$, where D(A)' and D(A)'' are the previous binary coding decisions for said given model context.

12. A method as in claim 9 wherein said model context has M bits of coding and N bits of history decision with value H(A), and further comprising means for assigning the coding context an index $(2**N)A+H(A)$, if the N bits were the low order bits of the coding context index.

13. A system as in claim 9 further comprising means for actuating said model context expanding means whenever unstable probability estimates are encountered during coding.

14. A system as in claim 8 wherein at least one model contains at least one previous binary coding decision for a model context and further comprising means, responsive to said determined previous decision, for dynamic model switching during coding.

15. A system as in claim 8 further comprising means for actuating said model context expanding means whenever unstable probability estimates are encountered during coding.

16. A system as in claim 8 wherein said data compression system comprises an arithmetic coder and further comprising means for actuating said model context expanding means whenever excess correlation between renormalizations of the arithmetic coder occurs during coding.

* * * * *